United States Patent [19]

Thiel

[11] Patent Number: 5,040,051
[45] Date of Patent: Aug. 13, 1991

[54] HYDROSTATIC CLAMP AND METHOD FOR COMPRESSION TYPE POWER SEMICONDUCTORS

[75] Inventor: Clifford G. Thiel, Stillman Valley, Ill.

[73] Assignee: Sundstrand Corporation, Rockford, Ill.

[21] Appl. No.: 279,727

[22] Filed: Dec. 5, 1988

[51] Int. Cl.⁵ ................... H01L 23/42; H01L 23/44
[52] U.S. Cl. ....................... 357/79; 357/82; 361/386; 361/382; 165/80.4; 165/104.33
[58] Field of Search .................. 357/79, 82, 81; 361/386, 382, 385; 165/80.5, 104.33

[56] References Cited

U.S. PATENT DOCUMENTS

| | | | |
|---|---|---|---|
| 3,551,758 | 12/1970 | Ferree | 317/234 |
| 3,654,528 | 4/1972 | Barkan | 317/234 |
| 3,789,248 | 1/1974 | Jaecklin et al. | 310/9.4 |
| 4,138,692 | 2/1979 | Meeker et al. | 357/82 |
| 4,155,155 | 5/1979 | Bourdon et al. | 357/79 |
| 4,313,128 | 1/1982 | Schlegel et al. | 357/79 |
| 4,392,153 | 7/1983 | Glascock, II et al. | 357/82 |
| 4,402,004 | 8/1983 | Iwasaki | 357/79 |
| 4,500,907 | 2/1985 | Takigami et al. | 357/79 |
| 4,739,447 | 4/1988 | Lecomte | 361/386 |
| 4,740,866 | 4/1988 | Kajiwara et al. | 361/382 |

FOREIGN PATENT DOCUMENTS

| | | | |
|---|---|---|---|
| 2805771 | 8/1979 | Fed. Rep. of Germany | 357/79 |
| 3342102 | 5/1985 | Fed. Rep. of Germany | 357/79 |
| 57-159050 | 10/1982 | Japan | 357/82 |
| 59-114848 | 7/1984 | Japan | 357/82 |
| 59-130450 | 7/1984 | Japan | 357/82 |
| 59-213151 | 12/1984 | Japan | 357/82 |
| 59-112214 | 12/1985 | Japan | 357/82 |
| 60-253248 | 12/1985 | Japan | 357/82 |
| 61-1053 | 1/1986 | Japan | 357/79 |
| 61-18159 | 1/1986 | Japan | 357/82 |
| 62-84539 | 4/1987 | Japan | 357/82 |
| 63-96946 | 4/1988 | Japan | 357/82 |
| 63-100759 | 5/1988 | Japan | 357/82 |
| 8701866 | 3/1987 | World Int. Prop. O. | 357/79 |

OTHER PUBLICATIONS

Balderes et al., "Liquid cooling of a multichip module package", IBM Tech. Disc. Bull., vol. 20, No. 11A, Apr. 1978.
Pascuzzo et al., "Integrated circuit module package colling structure", IBM Tech. Disc. Bull., vol. 20, No. 10, Mar. 1978.
Kleinfelder et al., "Liquid filled bellows heat sink", IBM Tech. Disc. Bull., vol. 21, No. 10, Mar. 1979.
Berndlmaier et al., "Liquid metal cooled integrated circuit module structures"IBM Tech. Disc. Bull., vol. 20, No. 11B, 4/1978.

*Primary Examiner*—Rolf Hille
*Assistant Examiner*—Minh Loan Tran
*Attorney, Agent, or Firm*—Antonelli, Terry, Stout & Kraus

[57] ABSTRACT

Hydrostatic clamping devices (20, 40) are provided to exert uniform pressure across the faces of components such as wafers (22) to constitute an integrated electronics package or power bar. The devices (20, 40) use the principle of hydrostatic pressure in a bladder (28, 41, 42) to provide uniform pressure to the faces of the components (22) through contacts (23). To permit the application of different but uniform forces to different components in a package, spreaders (34, 35) having end surfaces with unequal areas can be inserted between the bladders (28, 41, 42) and components (22) to cause the application of a different magnitude of force to the wafers (22) in a power bar.

21 Claims, 5 Drawing Sheets

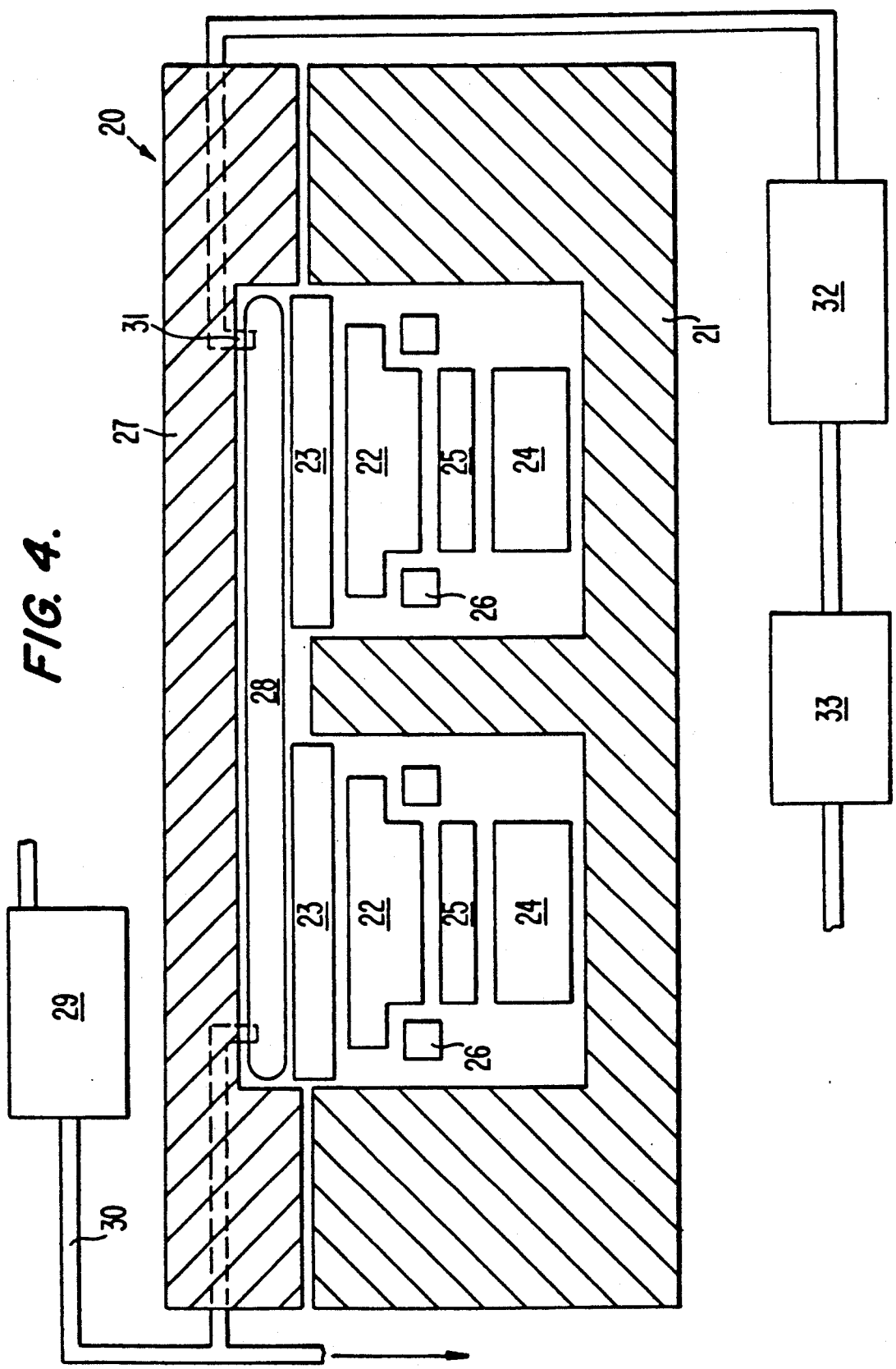

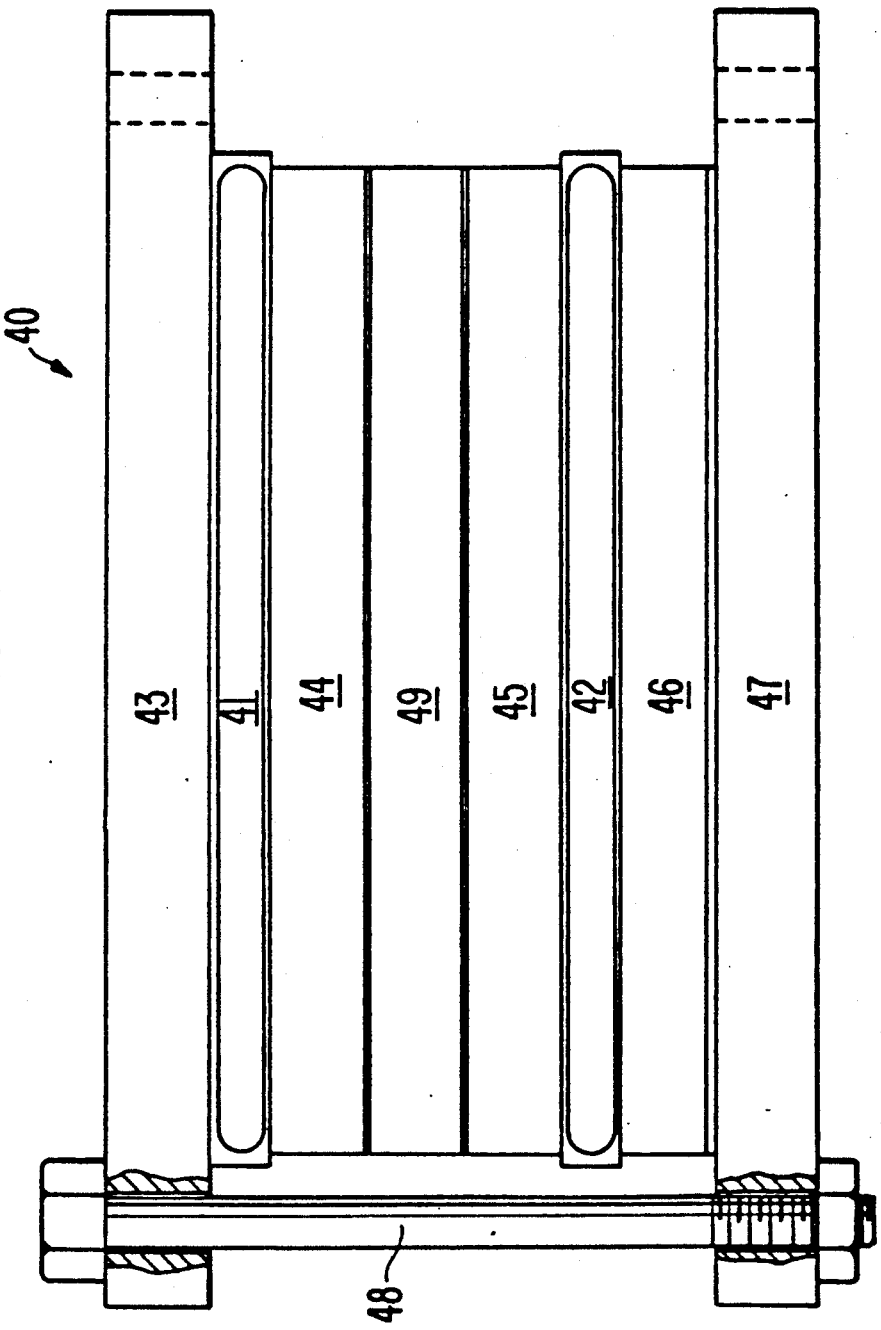

HYDROSTATIC CLAMP AND METHOD FOR COMPRESSION TYPE POWER SEMICONDUCTORS

TECHNICAL FIELD

The present invention relates to a clamp for electronic components. More particularly, the present invention relates to a hydrostatic clamp for compression-type power semiconductors in which different components are integrated into a single package.

BACKGROUND ART

An early arrangement for the flat packaging of semiconductors in an assembly of two or more such packages has been well known for some time. Opposed end plates and a heat sink housing between which are mounted two flat package semiconductor devices are held together by a tie rod and nut is shown in U.S. Pat. No. 3,551,758. In an effort to achieve a uniform force loading on each of the semiconductor devices, truncated cone shaped spring washers were arranged face to face or base to base in cavities in one of the end plates. A bearing plate in contact with the spring washers has some flexibility and is designed to assist in distributing the force loading uniformly over a bottom surface of a flexible portion of the housing and to permit effective levelling of the semiconductor devices. However, such an arrangement cannot assure that the pressure will be equal on the several wafers in a package, particularly if the wafers are not truly parallel or if the wafers are of different sizes. Furthermore, to the extent that wafers within a package have different clamping force requirements, the prior art as exemplified by this patent does not teach or suggest how that can be accomplished easily. Furthermore, the clamping arrangement results in a complex and bulky assembly which is undesirable where space savings and weight are important.

U.S. Pat. No. 3,654,528 shows a semiconductor wafer current controlling device in which a means for cooling a wafer is provided with the object to avoid the need for heavy clamping forces. In this arrangement, the wafers are mounted between two spaced apart ceramic mounting rings, the rings are clamped together under a modest amount of pressure and are surrounded by an insulating housing. This assembly is then mounted between a pair of substantially identical heat sinks comprising tubular outer member of a high conductivity metal which are clamped together by a plurality of elongated studs which utilize resilient washers. A small space is left between each end face of the heat sink members and an adjacent flange of sheet metal sealing members so as to contain liquid metal under pressure. The liquid metal heat from the wafer in passing radially outwardly along the lower face of the wafer and downwardly through an annular passage where the heat is released to the tubular heat sink member through the surface of a bore therein. After having released the heat extracted from the wafer, relatively cool liquid enters a channel extending across the bottom face of a heat sink core 60 and is again fed back to extract heat from the wafer. Although the purpose of the clamping studs is to substantially equalize fluid pressures developed in fluid passages on opposite sides of the wafer, the pressure is kept substantially equal by pumps. It will be readily appreciated, however, that such an arrangement is extremely complex, heavy and massive and does not provide for the simplicity and space-saving that is needed in applications where space is at a premium.

Another arrangement for holding a semiconductor element is shown in U.S. Pat. No. 3,789,248. This arrangement is concerned with the application of dynamic mechanical stresses which increase pressure and would otherwise exceed acceptable limits for the semiconductor elements, thereby leading to their destruction. To address this problem, pressure plates are provided which have convex or dome-shaped projections directed toward support plates. To establish clamping pressure, a pair of bolts extend between and through the spaced support plates. The surfaces of the support plates directed toward the dome-shaped configuration of the pressure plates are provided with a titanium carbide coating which does not undergo any substantial plastic deformation due to clamping action. As a result of such an arrangement, pressure increases due to dynamic mechanical stress remain within certain harmless limits and the clamped semiconductor assembly within the support plates is displaced symmetrically so that kinetic energy developed in dynamic mechanical stresses is transformed into harmless frictional heat. Although such a holder is relatively simple in construction, it is not particularly adapted for an integrated package wherein several different types of wafers may be included which require different clamping forces. Furthermore, it does not take into account that the component faces may not be parallel because of manufacturing tolerances.

U.S. Pat. No. 4,138,692 is primarily a cooling arrangement which uses fluid to cool but not to clamp a chip. A resilient bellows is provided for the purpose of adjusting to dimensional variations of each chip so that a relatively flat surface engagement can be achieved. Although such an arrangement may be effective as a cooling system, it does not provide for positive clamping of a semiconductor wafer. Coolant such as helium gas which is provided between a cap and a flange from the substrate which defines a hermetic chamber is for the purpose of cooling and not clamping. Such an arrangement cannot provide the positive compression forces required for large semiconductor packages.

The concept of an integrated electronics package is shown in U.S. Pat. No. 4,313,128. For example, a rectifier and thyristor may be enclosed within the same case. The package is held between a first bar member and a second bar member which are compressed by tightening bolts passing through the bars to apply a compressive force. This arrangement contains the disadvantage that it does not necessarily apply compressive forces to each of the wafers in the package uniformly and may well exceed the recommended compressive force for a particular wafer.

The clamping means disclosed in U.S. Pat. No. 4,392,153, shows a thyristor held between two blocks to which heat sinks are fastened. A diffusion bonding press forming thermo-compression diffusion bonds in the semiconductor device comprises an upper metallic plate parallel to a lower metallic plate which are joined by bolts so that a thermo-compression diffusion bond can be achieved between a heat sink and a copper strain buffer placed in the diffusion bonding press and heated. However, this press is not intended as part of the final assembly and does not deal with the problem of uniformity of forces on the thyristor components.

U.S. Pat. No. 4,402,004, discloses a transistor element mounted on a supporting plate. An upper disc and a lower disc press toward each other with the semiconductor element disposed therebetween so as to establish electrical contact. However, this arrangement is not concerned with the problems arising from variations in manufacturing tolerances as well as using different semiconductor elements which require different clamping forces.

Another pressure-applied type semiconductor device is shown in U.S. Pat. No. 4,500,907. A semiconductor body has a metal stamp provided on one side thereof along with a thermal compensation plate. The metal stamp is provided with an annular peripheral groove or other type of groove so that the groove is deformed when compressive load is applied to the semiconductor body. This is intended to alleviate local stress concentration in the semiconductor body as in the area of the body right beneath the edge of the metal stamp. While such an arrangement may be useful for preventing point application of stresses, it is not helpful where several different types of wafers are to be used and a simple arrangement is needed to apply a uniform clamping force in a relatively small package.

A clamping arrangement proposed for integrated wafer packages is shown in U.S. Pat. No. 4,739,447. In that arrangement, there is provided a molded frame having a recess in which is fitted a unilateral heat sink. A clamping device is associated with each of the semiconductors through a common connecting bar. Although this arrangement is intended to accommodate semiconductor power components of varying heights in a package and to facilitate the mounting and connection of these components, it requires individual clamping devices for each component and thus unduly complicates the package arrangement.

German Offenlegungsschrift No. 2805771 discloses a chip mounted in a liquid-type metal case which is under pressure from a cooling medium. The chip is pressed to at least one wall of the case by the cooling medium. This arrangement applies uniform pressure across the chip only if the pressing plate forced against the chip by the coolant pressure is true and contacts the chip uniformly across its surface. Moreover, a separate arrangement would have to be provided for each chip in a package which would result in a complex package arrangement.

German Offenlegungsschrift No. 3342102 shows a semiconductor wafer clamped between triangular heat dissipating plates which are clamped together by three axial bolts. Each of the plates carries a pattern of projections which form contact surfaces and spacer which leave room for circulating cooling fluid. This arrangement does not solve the problems arising from non-uniform compression forces and does not provide simplicity needed in an integrated wafer package.

Power bars employ large power semiconductors, i.e. a diameter in excess of 15 mm, which are mounted to the board by use of compressive force rather than by soldering for making electrical and thermal connections. Consequently, manufacturers of power semiconductors require that the surface to which the semiconductor is fixed be extremely flat. Compressive forces on the semiconductor must be within a range specified by the manufacturer and also be evenly distributed over the surface of the semiconductor. There is often a need to fix a heat sink to the top of each of the semiconductors. The bottom surface of a heat sink would also have to be extremely even to be pressed against the semiconductor surface within the tolerance range.

Manufacturers of large wafers recommend several methods for mounting which result in "hockey puck" power transistors and thyristors. In one method, the transistor is mounted between two heat sinks having a required surface flatness of 0.0005 in. to 0.001 in. maximum between the highest and lowest points in the area where the device sits.

Another technique requires a peak-to-trough of 30-40 μm in the seating area. In either of the aforementioned mounting techniques, however, it is absolutely essential that the compression or clamping force be equally distributed across the device contact faces in order to ensure that good electrical and thermal contacts are made between the external heat sinks and between the wafer itself and the contact areas internally of the wafer. The latter is made possible by allowing large metal contacts on the top and bottom of the wafer in the "hockey puck" to move slightly relative to the ceramic sides of the wafer.

Such "hockey puck" packages are relatively large and heavy. Consequently, such packages are unsuitable in applications where size and weight must be minimized such as, for example, in aircraft applications. Accordingly, it has been recognized that to minimize the size and weight of an electronics assembly, the wafers used in the hockey puck wafer package must be put into smaller and lighter packages. Nevertheless, the wafer-to-contact interface must nevertheless remain under compression as specified by the wafer manufacturers.

Users of such wafer packages also desire to package as many wafers for an electronic assembly in a single package to shorten electrical interconnections. Such an integrated electronics package is then clamped to a heat sink/exchanger to cool the semiconductors in the package.

However, an integrated electronics package containing different components has problems. One problem arises from the fact that the similar wafers which are not uniform in diameter, thickness or clamping force requirements are intended to be used in the same package. For instance, the package designated generally by the numeral 10 in FIGS. 1 and 2 utilizes three transistors 11,12,13 and two diodes 14,15 integrated in a thin flat package 16. In order to meet the clamping force specifications on each wafer when this package is clamped to a heat sink, the surfaces of the heat sink, clamp and electronic package must be perfectly flat and parallel to assure that the compressive force will be uniform across the top and bottom faces 17,18 of the package. However, normal manufacturing tolerances alone will often prevent achieving a truly flat and parallel top and bottom faces. In that instance, the compressive force on the package will not be uniform and the semiconductors will not be evenly clamped to their specified values as shown schematically in FIG. 3 where the right side of the top surface 17 is higher than the left side causing greater concentration of forces on the components 14,15 and less force than desired on the transistor 12.

Disclosure Of Invention

The foregoing problems have been overcome in accordance with the present invention with the recognition that pressure in a static fluid is equal in all directions regardless of the fluid boundary shape. This principle has been utilized in the present invention by providing a pressurized fluid layer in a flexible bladder which is inserted between external clamp plates and a top or bottom surface of the electronics package or, alternatively, between the electronics package top and the electrical contacts. The foregoing arrangement allows the fluid layer to compensate for any irregularities in flatness or parallelism while, at the same time, maintaining uniform pressure over the surface of the semiconductor wafer.

An object of the present invention is to provide hydrostatic clamping of wafer packages or power bars in order to achieve a simple and yet effective clamping to assure good electrical contact.

A further object of the present invention is to avoid the problems and disadvantages encountered in prior art methods for providing a compression force for electrical and thermal connections.

Yet another object of the present invention is to allow the integration of several different types of electronic components in one package called a power bar without the need for special precautions to achieve uniform thermal and electrical contacts.

Still a further object of the present invention is to provide packaging for wafers which avoids a "hockey puck" configuration so that the electronic packages can be used in applications where size and weight are minimal.

BRIEF DESCRIPTION OF DRAWINGS

These and other features, objects and advantages of the present invention will become more apparent from the following description when taken in conjunction with the accompanying drawing wherein:

FIG. 4 is a cross-sectional elevational view of one embodiment in accordance with the present invention;

FIG. 7 is an elevational view of a third embodiment in accordance with the present invention where fixed volume fluid bladders are sandwiched between a clamp plate and the power bar in an assembly of several power bars.

BEST MODE FOR CARRYING OUT THE INVENTION

Figure 1:
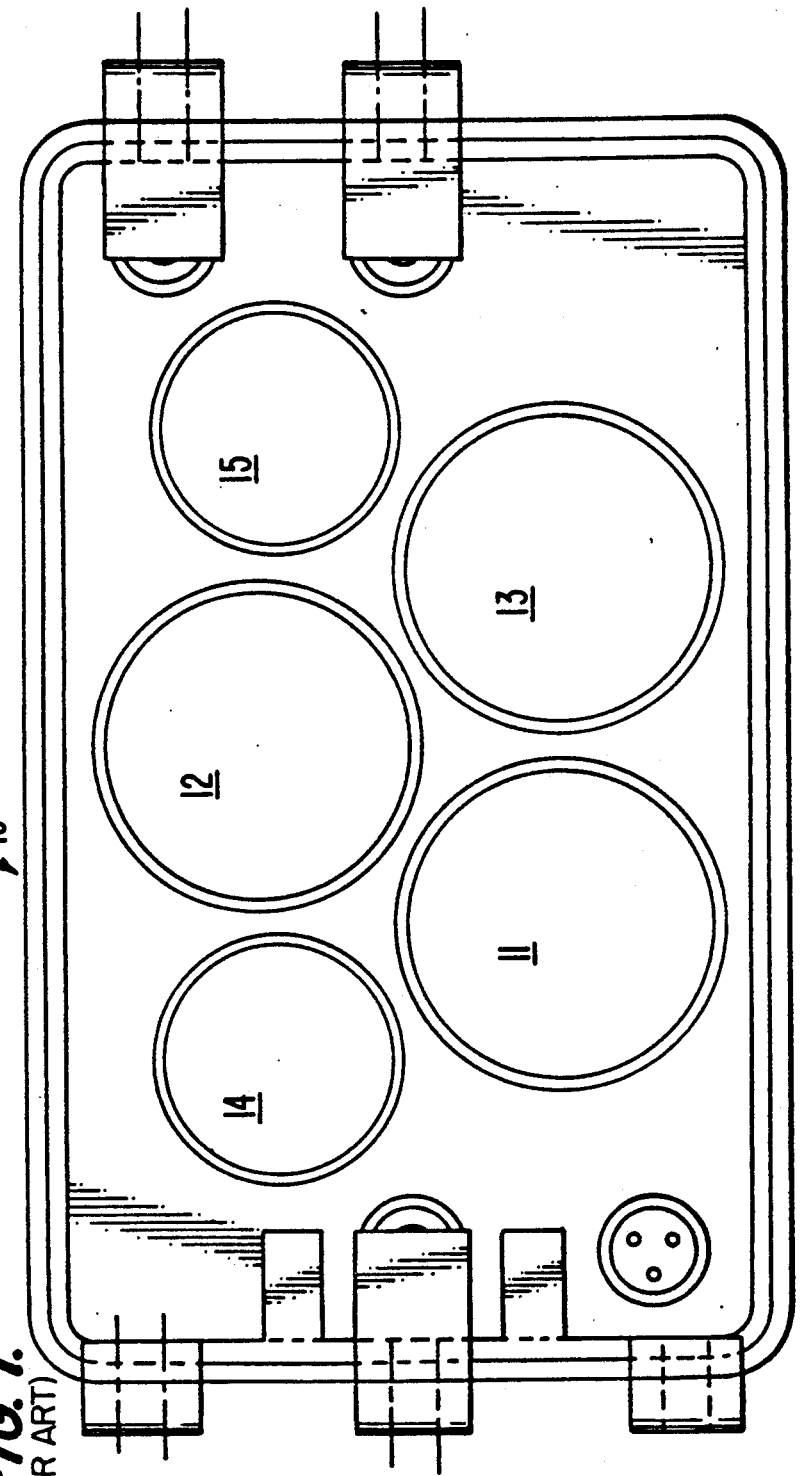
FIG. 1 is a plan view of a type of electronic packages employing three transistors and two diodes integrated into a conventional thin flat package.
Figure 2:
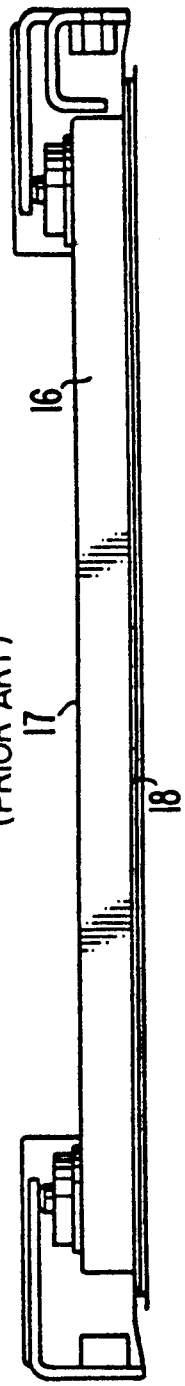
FIG. 2 is a elevational view of the integrated electronics package of FIG. 1.
Figure 3:
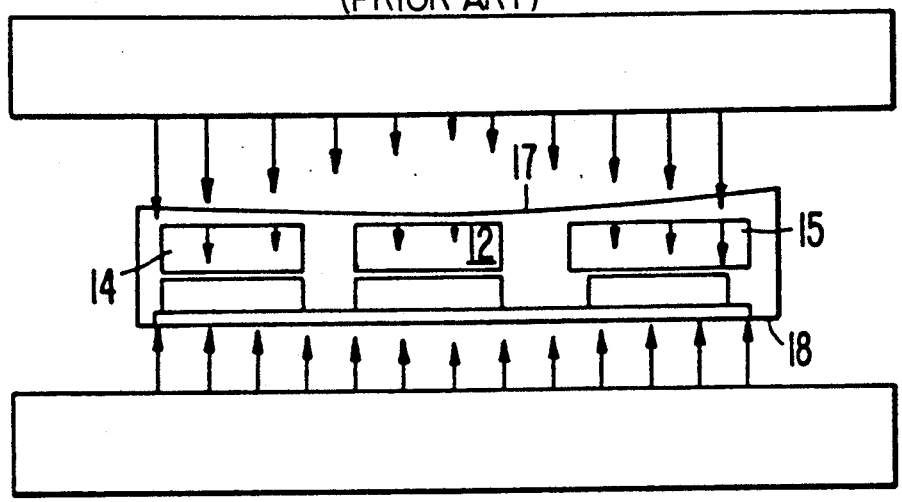
FIG. 3 is a schematic view showing compression forces applied by clamping plates to top and bottom faces of an integrated electronics package of the type shown in FIGS. 1 and 2 wherein the top surface is not flat and parallel to the bottom surface and thus the compression forces are also not uniform.

Referring now to the drawings and, in particular, to FIG. 4, a power bar is designated generally by the numeral 20. The power bar consists of two portions with the bottom portion or frame 21 housing therein several semiconductor wafers 22. The wafers 22 are of conventional construction and include collector contacts 23, emitter contacts 24, moly plates 25 and a base contact 26. The top portion or cover 27 contains a flexible fluid reservoir in the form of a bladder 28 which is selectively pressurized to provide the clamping force to the wafers thereunder. Fluid pressure is generated externally of the power bar by means of a pump 29 and is connected to the bladder by means of pressure-rated tubing 30. The bladder can be made of thermally conductive material and have an outlet 31 through which pressurized fluid can be circulated through a cooler 32 by means of a low differential pressure pump 33. The bladder can also be made of material which is not thermally conductive, in which case the outlet circulating loop would not be needed since the heat would have to be conducted away by the collector contacts 23 which in the illustrated embodiment also serve as clamping force changer to apply the desired force on the surface of the wafers 22.

Figure 5:
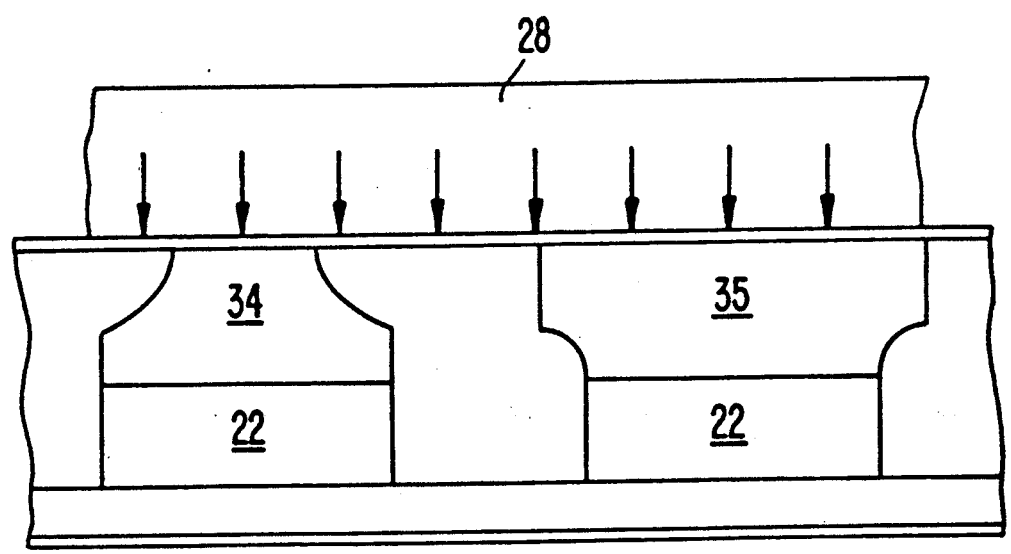
FIG. 5 illustrates the different types of force changers which can be used as part of the invention to provide specified clamping forces where wafers within the power bar have dissimilar compression force requirements.

Although the hydrostatic clamping bladder of the present invention can provide an equal pressure in all directions, it will be necessary in certain applications to use wafers within the power bar which have unequal compression force requirements. Accordingly, as shown in FIG. 5, different types of force changer 34,35 can be provided between the bladder 28 and the wafers 22 to provide specified but different clamping forces depending upon the given fluid pressure transmitted through the bladder. The ratio of the cross-sectional area of a first surface opposed to the semiconductor wafer 22 and a second surface opposed to the bladder determines if the pressure applied to the wafers is higher or lower than the pressure applied from the fluid to the bladder 28. For instance, the force changer 34 on the left in FIG. 5 will provide a lower clamping force than the force changer 35 on the right.

Figure 6:
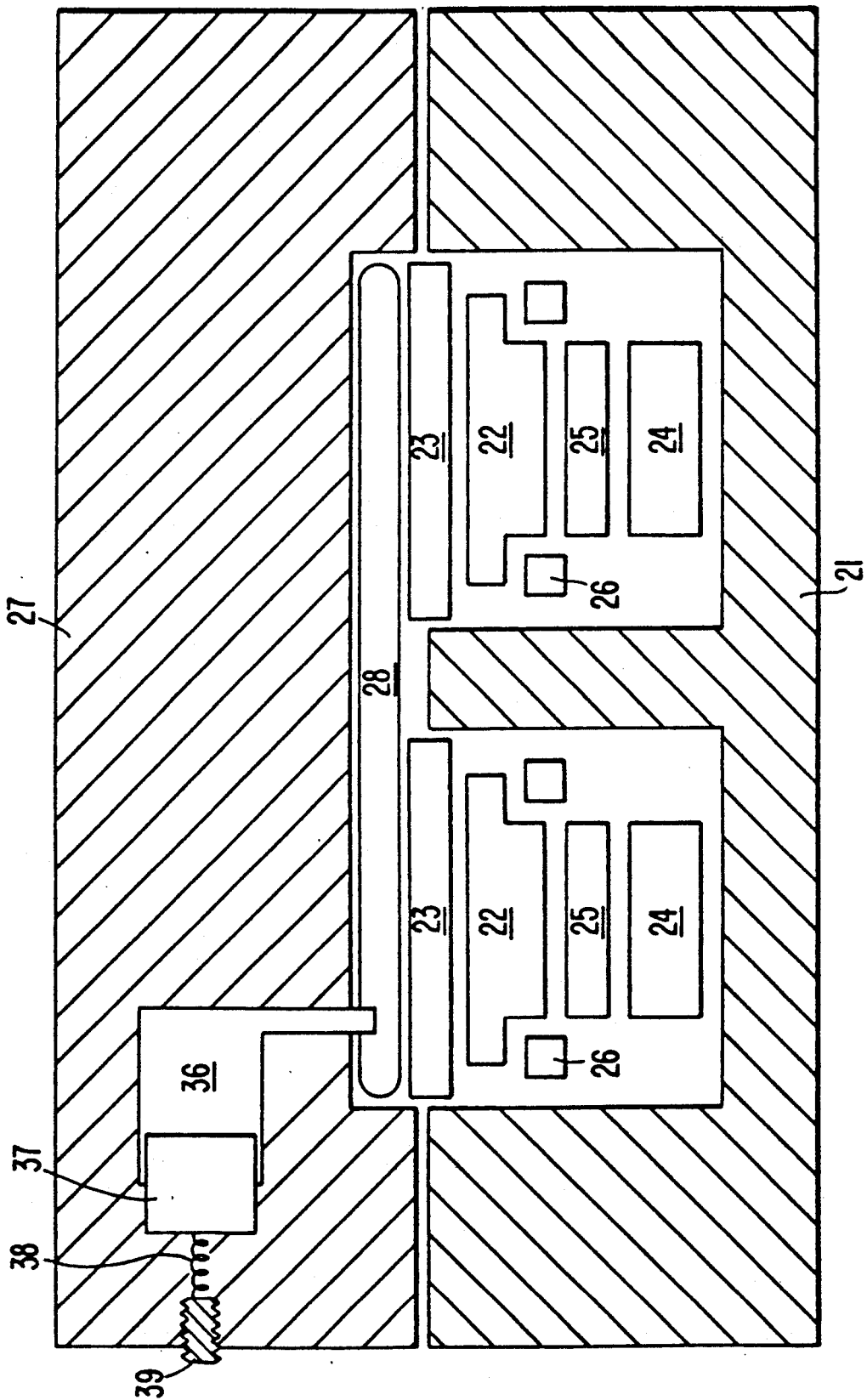
FIG. 6 is a cross-sectional elevational view of a second embodiment in accordance with the present invention.

According to another embodiment of the present invention, the external pressure tubing 30 shown in FIG. 4 can be replaced by a pressurized reservoir 36 contained within the power bar cover as shown in FIG. 6. Reservoir pressure would then be maintained by means of a cylinder 37 loaded by a spring 38 whose biasing force can be adjusted with a set screw 39. It will be appreciated that such an arrangement greatly simplifies the pressure mechanism. The parts in this embodiment which are similar to FIG. 4 are designated by the same numerals.

Another embodiment of the present invention is shown in FIG. 7 wherein the assembly 40 includes two fixed volume flexible fluid bladders 41,42 sandwiched, respectively, between a clamp plate 43 and power bar 44 and between two power bars 45,46. The clamp plates 43,47 at the top and bottom of the assembly 40 are drawn together by tightening up on two or more clamping bolts 48 (only one of which is shown) until fluid pressure inside the bladders is at the desired level. The fluid pressure will be equal to the sum of the tension forces in the clamping bolts 48 divided by the contact area at the interface between the clamp plate 43 and the fluid bladder 41 and between the power bars 45,46 and the bladder 42. Again, if different forces are needed for different wafers within the power bar, such differences can be accommodated by using shaped electrical contact/force spreaders as shown in FIG. 5. Furthermore, a heat exchanger 49 can be provided intermediate of the two power bars 44,45 and also be part of the bottom clamp plate 47.

While I have shown and described several embodiments within the scope of my present invention, it is to be clearly understood that the same is susceptible of numerous changes and modifications as will be apparent to one of ordinary skill in the art. For example, the bladder can be made of Neoprene with a Kevlar cover.

However, other types of bladder materials can be used. Therefore, I do not intend to be limited to the details shown and described herein but intend to cover all such changes and modifications as are encompassed by the scope of the appended claims

I claim:

1. A hydrostatic clamping device for a plurality of compression type heat generating components requiring uniform pressure across exterior faces of the components to complete electrical connection between faces of the components and contacts facing the faces comprising:
   a frame for mounting the components;
   a cover coupled to the frame for defining a volume containing the components;
   a bladder disposed within the volume and having a fluid therein for coupling the uniform pressure to the faces of the components to complete the electrical connection between the faces and the contact; and
   a force changer having first and second opposed surfaces with different surface areas and disposed between the bladder and at least one of the components for coupling a pressure from the first surface to one of the faces of the at least one of the components which is different than a pressure coupled to the second surface from the bladder.

2. A hydrostatic clamping device according to claim 1, wherein:
   the fluid is a cooling fluid which ensures adequate cooling of each of the components through the bladder as a result of the uniform pressure.

3. A hydrostatic clamping device according to claim 1, further comprising:
   a pump for pumping fluid into and out of the bladder.

4. A hydrostatic clamping device according to claim 3 wherein:
   the fluid is a cooling fluid which provides cooling of the components through the bladder.

5. A hydrostatic clamping device according to claim 1 further comprising:
   a spring actuated piston mechanism for supplying the fluid under pressure to the bladder.

6. A hydrostatic clamping device according to claim 5 wherein:
   the fluid is a cooling fluid which provides cooling of the components through the bladder.

7. A hydrostatic clamping device for a plurality of power bars with each power bar having at least one heat generating component requiring uniform pressure across exterior faces of the components to complete electrical connection between the faces of the components and contacts facing the faces comprising:
   a bladder, having a fluid therein, for coupling the uniform pressure to the faces of the components to complete electrical connection between the faces and the contacts;
   a heat exchanger in contact with exterior faces of the components of the power bars;
   a clamp for clamping the power bars and the bladder together to couple the uniform pressure to the exterior faces of the components and the contacts to complete the electrical connection between the contacts and the faces of the components; and
   a force changer having a first and second opposed surfaces with different surface area and disposed between the bladder and at least one of the components for coupling a pressure from the first surface to one of the faces of the at least one of the components which is different than a pressure coupled to the second surface from the bladder.

8. A hydrostatic clamping device according to claim 7 wherein:
   the fluid is a cooling fluid which provides cooling of the components through the bladder.

9. A hydrostatic clamping device according to claim 7 further comprising:
   a force changer having first and second opposed surfaces with different surface areas and disposed between the bladder and at least one of the components for coupling a pressure from the first surface to one of the faces of the at least one of the components which is different than a pressure coupled to the second surface from the bladder.

10. A method of completing an electrical connection between opposed faces of compression type semiconductor devices and contacts opposed to the faces by applying a uniform pressure between the contacts and the faces comprising:
    positioning a bladder having a fluid disposed therein opposed to at least one face of the semiconductor devices; and
    pressurizing the fluid to couple the uniform pressure between the contacts and the faces to complete the electrical connection; and wherein
    a pressure applied to a face of at least one of the components is different than a pressure applied from the fluid to the bladder.

11. A method in accordance with claim 10 wherein:
    the pressurizing of the fluid is provided by a source of pressurized fluid coupled to the bladder.

12. A method in accordance with claim 11 wherein:
    the pressure applied to the face of the at least one of the components is higher than the pressure applied from the fluid to the bladder.

13. A method in accordance with claim 11 wherein:
    the pressure applied to the face of the at least one of the components is lower than the pressure applied from the fluid to the bladder.

14. A method in accordance with claim 11 wherein:
    the source of pressurized fluid pumps pressurized fluid to the bladder to provide the uniform pressure.

15. A method in accordance with claim 14 wherein:
    the pressure applied to the face of the at least one of the components is higher than the pressure applied from the fluid to the bladder.

16. A method in accordance with claim 14 wherein:
    the pressure applied to the face of the at least one of the components is lower than the pressure applied from the fluid to the bladder.

17. A method in accordance with claim 10 wherein:
    the pressurizing of the fluid is provided by a spring and piston which apply a set hydraulic pressure to the bladder to provide the uniform pressure.

18. A method in accordance with claim 17 wherein:
    the pressure applied to the face of the at least one of the components is higher than the pressure applied from the fluid to the bladder.

19. A method in accordance with claim 17 wherein:
    the pressure applied to the face of the at least one of the components is lower than the pressure applied from the fluid to the bladder.

20. A method in accordance with claim 10 wherein:
    the pressure applied to the face of the at least one of the components is higher than the pressure applied from the fluid to the bladder.

21. A method in accordance with claim 10 wherein:
    the pressure applied to the face of the at least one of the components is lower than the pressure applied from the fluid to the bladder.

* * * * *